United States Patent [19]

Sexton

[11] Patent Number: 4,959,400

[45] Date of Patent: Sep. 25, 1990

[54] RESIN COMPOSITION COMPRISING A POLYHYDRIC PHENOLIC HARDENER

[75] Inventor: Diane Sexton, Lauf, Fed. Rep. of Germany

[73] Assignee: The Dow Chemical Company, Midland, Mich.

[21] Appl. No.: 398,337

[22] Filed: Aug. 24, 1989

Related U.S. Application Data

[60] Continuation of Ser. No. 92,029, Sep. 1, 1987, abandoned, which is a division of Ser. No. 892,022, Jul. 30, 1986, Pat. No. 4,713,137.

[30] Foreign Application Priority Data

Jul. 31, 1985 [GB] United Kingdom ............. 85 19290

[51] Int. Cl.$^5$ .................. C08K 3/32; C08L 63/00
[52] U.S. Cl. ................... 523/451; 523/452; 523/453; 523/440; 528/104; 525/523; 525/485
[58] Field of Search ........... 523/451, 452, 453, 440; 528/104; 525/523, 485

[56] References Cited

U.S. PATENT DOCUMENTS

| | | | |
|---|---|---|---|
| 4,046,733 | 9/1977 | Smith et al. | 523/453 |
| 4,331,582 | 5/1982 | Babayan | 523/453 |
| 4,366,295 | 12/1982 | Tyler, Jr. et al. | 525/482 |
| 4,604,317 | 8/1986 | Berman et al. | 428/285 |
| 4,668,718 | 5/1987 | Schreiber | 523/451 |

FOREIGN PATENT DOCUMENTS

| | | |
|---|---|---|
| 1055922 | 1/1964 | United Kingdom . |
| 1249196 | 1/1969 | United Kingdom . |
| 1242766 | 5/1969 | United Kingdom . |
| 1229145 | 7/1969 | United Kingdom . |

*Primary Examiner*—John C. Bleutge
*Assistant Examiner*—Vasu S. Jagannathan

[57] ABSTRACT

An epoxy resin composition having exceptional stability which is useful in the preparation of electrical laminates comprises an epoxy resin such as the diglycidyl ether of bisphenol A, an organic solvent, a polyhydric phenolic hardener and an acid having a pKa at 25° C. of less than 2.5 or an ester or anhydride of such acid. The epoxy resin composition can also contain a bishenol or bisphenol derivative such as bisphenol A. In addition, an accelerator such as an alkyl substituted imidazole can also be added to the composition prior to its use as in the preparation of electrical laminates.

18 Claims, No Drawings

RESIN COMPOSITION COMPRISING A POLYHYDRIC PHENOLIC HARDENER

This is a continuation, of application Ser. No. 092,029 filed Sept. 1, 1987, a division of Ser. No. 892,022 filed July 30, 1986, now abandoned, which is now U.S. Pat. No. 4,713,137.

BACKGROUND OF THE INVENTION

The present invention relates to an epoxy resin composition and to a method for preparing electrical laminates using said composition.

Heretofore, laminates used in the preparation of electrical circuit boards have been conventionally produced by impregnating a supporting or reinforcing web with a resin composition by passing the web through a bath containing the resin composition (conventionally referred to as a "varnish") and subsequently passing the impregnated web through a heated chamber where any solvent is removed and the resin partially cured or advanced. One or more layers of the impregnated web (conventionally referred to as a "prepreg") are then sandwiched between thin layers of an electrical conductive material such as copper foil under heat and pressure. The resulting construction, which is commonly referred to as an electrical laminate, is further processed into a circuit board.

An epoxy type resin is often employed for impregnating the reinforcing web. A typical epoxy resin varnish composition for such application comprises a brominated epoxy resin prepared from a diglycidyl ether of bisphenol A and a tetrabromobisphenol A, dicyanidiamide as a hardener or curing agent, an organic solvent such as acetone and an accelerator. Unfortunately, due to relative instability of the composition, the epoxy resin, hardener, solvent and accelerator or catalyst must be combined shortly prior to the intended use of the composition. In addition, the dicyandiamide curing agent is often of very limited solubility in organic liquid and therefore tends to crystallize in the varnish composition and/or on the prepeg made from the varnish. To maintain the desired solubility requires that the solvent be selected from a relatively narrow group of compounds and large amounts of solvent be employed.

An alternative varnish composition for applying to the reinforcing web used in the preparation of electrical laminates comprises a blend of a diglycidyl ether of bisphenol A and either bisphenol A or tetrabromobisphenol A, a dicyandiamide curing agent, a solvent and, optionally, an accelerator. The diglycidyl ether of bisphenol A is reacted in situ with the bisphenol A and/or tetrabromobisphenol A and dicyandiamide during impregnation of the reinforcing web and advancement of the resin. See, for example, U.S. Pat. No. 3,738,862. Unfortunately, the epoxy resin, polyhydric phenol, solvent, curing agent and accelerator must again be combined shortly prior to use to prevent increases in viscosity or crystallization of the hardener from the composition.

Yet another composition has been proposed for use in the preparation of electrical laminates. This composition comprises an epoxy resin, an organic solvent, a hardener derived from a hexa-alkyl ether of a hexamethylol melamine and, optionally, a polyhydric phenol and an accelerator. Unfortunately, although not as severe as with the other known varnish compositions, the described varnish composition still exhibits some increases in viscosity over time.

In all cases, similar composition to those described except containing no accelerator will exhibit increased stability and, hence a longer shelf life. Specifically, the composition is prepared without the accelerator and the accelerator is added only shortly prior to the actual use of the varnish composition in the laminating/coating operation. However, the shelf life of the composition is still limited due to the large increases in viscosity experienced by the composition over a relatively short period of time. For example, although the shelf life is dependent on the solids content and the specific solvent employed, a composition comprising a liquid epoxy resin such as the diglycidyl ether of bisphenol A, a polyhydric alcohol such as bisphenol A and dicyanamide will often possess a shelf life of only 2–3 weeks prior to the viscosity of the composition increasing sufficiently to render the composition unusable or the dicyanamide coming out of solution.

In view of the deficiencies of the prior art varnish compositions for us in the preparation of electrical laminates, it would be highly desirable to provide a varnish composition based on a stable epoxy resin/hardener system which does not possess the deficiencies of the prior art.

SUMMARY OF THE INVENTION

Accordingly, in one aspect, the present invention is an epoxy resin composition useful for preparing electrical laminates which exhibits significantly improved stability and, hence longer shelf life than the epoxy resin compositions used for the same purposes of the prior art. Specifically, the epoxy resin composition of the present invention comprises an epoxy resin, an organic solvent, a hardener, and, optionally, a bisphenol or bisphenol derivative and/or an accelerator wherein the hardener is a polyhydric phenolic hardener and the epoxy resin composition further contains an acid having a pKa, of 2.5 or less at 25° C. or an ester or anhydride of such acid.

The incorporation of a small amount of the strong acid or an ester or anhydride of the strong acid into a varnish composition containing a polyhydric phenolic hardener has been found to increase the stability of the varnish composition. Specifically, the viscosity of the composition containing the strong acid or an ester or anhydride of a strong acid has been found to increase at a significantly slower rate than an identical composition containing no acid, ester of anhydride. Therefore, the varnish compositions of the present invention exhibit a significantly longer shelf life than the prior art compositions.

In another aspect, the present invention is a process for preparing electrical laminates. The process comprises the steps of (a) impregnating a reinforcing web with an epoxy resin composition containing an epoxy resin, a hardener, an organic solvent and, optionally, a polyhydric phenol; (b) heating the thus prepared prepeg at a temperature sufficient to cure the epoxy resin and (c) subsequently fabricating the prepeg into an electrical laminate by laminating one or more layers of the prepreg with an electrical conductive material and heating thus prepared laminate at elevated temperature and pressure; wherein the hardener is a polyhydric phenolic hardener and the epoxy resin composition further contains an acid having a pKa at 25° C. of 2.5 or less or an ester or anhydride of such acid. When using the epoxy resin composition in the preparation of electrical laminates, an accelerator for the reaction of the epoxy resin with the hardener is advantageously incorporated into the composition prior to the impregnation of the reinforced web with the composition. Since the accelerator tends to accelerate the instability (i.e. viscosity (increase) exhibited by the epoxy resin composition, it is preferably added to the composition shortly prior to use so that the viscosity of the composition is not sufficiently increased following the addition of the accelerator so that the composition is not usable in the lamination operation.

DETAIL DESCRIPTION OF THE INVENTION

The epoxy resin component of the composition of the present invention is suitably a compound which possesses more than one 1,2-epoxide group. In general, the epoxy resin component is saturated or unsaturated aliphatic, cycloaliphatic, aromatic or heterocyclic and can be substituted with one or more non-interfering substituent such as halogen atoms, phosphorus atoms, hydroxyl groups and ether radicals. The epoxy resin component can be monomeric or polymeric.

Such epoxy resins are well known in the art and reference is made thereto for the purposes of this invention. Illustrative examples of epoxy resins useful in the practice of the present invention are described in *The Handbook of Epoxy Resins* by H. Lee and K. Neville published in 1967 by McGraw-hill, New York, in appendix 4-1, pages 4-35 thru 4-56 and U.S. Pat. Nos. 2,633,458, 3,477,990, (particularly column 2, line 39 to column 4, line 75), 3,821,243, 3,907,719, 3,975,397 and 4,071,477.

Epoxy resins of particular interest in the practice of the present invention include the glycidyl polyethers of 2,2-bis(4-hydroxyphenyl) propane (generally referred to as bisphenol A) and 2,2-bis(3,5-dibromo-4-hydroxyphenyl) propane (general referred to as tetrabromobisphenol A); the glycidyl ethers of a novolac resin, i.e., phenol aldehyde condensates of the formula:

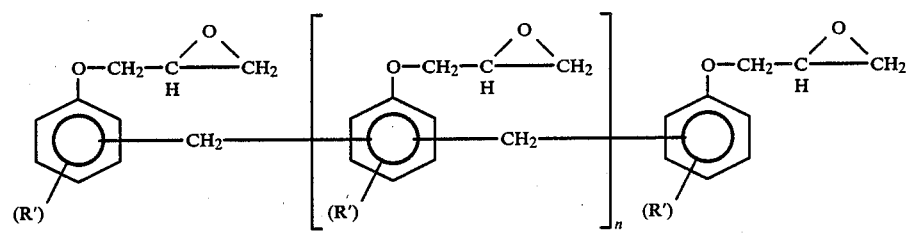

wherein R' is hydrogen or an alkyl radical and n is an integer from 1 to 10, and the glycidyl ethers of tris(-phenol), i.e.,

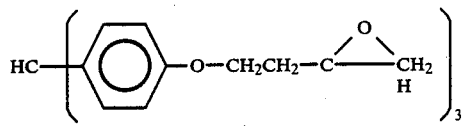

such as described in U.S. Pat. No. 4,394,496. In addition, mixtures of one or more epoxy resins are also usable in this invention. Most preferred epoxy resins are the liquid glycidyl polyethers of bisphenol A, the glycidyl polyethers of tetrabromobisphenol A and mixtures thereof.

The epoxy resin composition will generally comprise from 5 to 50, preferably 15 to 40, weight percent of the epoxy resin wherein said weight percent is based on the total weight of the composition.

The organic solvents for the epoxy resin compositions of the present invention are suitably those organic liquids in which the epoxy resin and polyhydric phenolic hardener are soluble and which are sufficiently volatile such that they escape from the epoxy resin composition before and/or during advancement and/or cure. Illustrative examples of such organic liquids include various glycol ethers such as ethylene or propylene glycol monomethylether and the esters thereof such as ethylene glycol monoethylether acetate; ketones such as methylisobutyl ketone, methylethyl ketone, acetone and methylisopropyl ketone; and aromatic hydrocarbons such as toluene and xylene or mixtures thereof. Of such organic liquids, those preferably used as the solvent in the epoxy resin composition of the present invention are the ketones, particularly acetone, methyl ethyl ketone and methyl isobutyl ketone, or mixtures of these ketones with each other or with one or more of the other solvents.

The amount of solvent most advantageously employed in the epoxy resin composition of the present invention will vary depending on a variety of factors including the particular solvent, polyhydric phenolic hardener and epoxy resin employed, the desired properties of the epoxy resin composition (e.g., desired viscosity of the epoxy resin composition and the desired resin "pick-up" of this composition by the reinforcing web.). Advantageously, the composition exhibits a viscosity from 50 to 1000 milliPascal seconds (mPa·s) measured using a Brookfield viscometer, Type RVT, 20 rpm and the appropriate spindle at 25° C. In general, the amount of solvent will range from 10 to 80, preferably from 10 to 60, weight percent, based on the total weight of the epoxy resin composition, the remainder comprising non-volatile components (amount of the total solids other than the solvents). More preferably, the epoxy resin composition will contain from 15 to 40 weight percent of the solvent and from 85 to 60 weight percent non-volatiles.

The polyhydric phenolic hardener useful in the epoxy resin composition of the present invention is suitably any polyhydric phenolic compound which is soluble in the solvent and which is capable of curing the epoxy resin. Representative of such polyhydric phenolic compounds are the phenolic or cresol novolacs and the reaction products of a polyfunctional amine with a phenolic resin.

In a preferred embodiment of the present invention, the polyhydric phenolic hardener employed in the practice of the present invention is the reaction product of a hexa-alkyl ether of a hexamethylol melamine with one or more polyhydric phenols or one or more polyhdyric phenols and one or more monohydric phenols wherein the phenolic compound(s) and hexa-alkyl ether of hexamethylol melamine are reacted in an amount sufficient to provide more than one reactive phenolic hydroxyl group for each alkoxy group. The epoxy resin compositions prepared using this polyhydric phenolic hardener exhibit excellent properties. In particular, the compositions exhibit a higher glass transitions temperature, e.g., up to and exceeding 160° C., than an epoxy resin composition prepared using a dicyanamide hardener. In addition, the polyhydric phenolic hardener component is soluble in most common organic solvents used in preparing electrical laminates and the problems of crystallization experienced with a dicyandiamide hardner are effectively eliminated.

The hexa-alkyl ether of a hexamethylol melamine preferably employed in preparing the polyhydric phenolic hardener have the general formula:

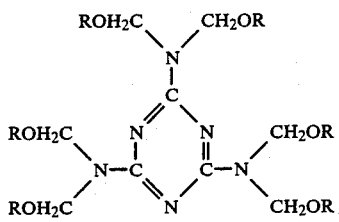

wherein each R is individually an alkyl radical having from 1 to 4 carbon atoms. Illustrative examples of such hexa-alkyl ethers of hexamethylol melamine include hexamethoxy methylmelamine, hexaethoxy methylmelamine, hexapropoxy methylmelamine, hexaisopropoxy methylmelamine, hexa-1-butoxy methylmelamine, and hexaisobutoxy methylmelamine. Mixtures of two or more hexa-alkyl ethers of hexamethylol melamine can also be employed herein. Hexamethoxymethyl melamine is most preferred.

The polyhydric phenols advantageously employed in preparing the polyhydric phenolic hardeners are the polyhydric phenolic compounds containing from 2 to 6 phenolic hydroxy groups and from 6 to 30 carbon atoms. Preferably, the polyhydric phenols employed in the practice of the present invention have the formula:

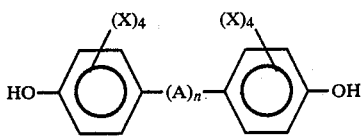

wherein A is oxygen, sulphur, —S—S—, —CO—, —SO—, —SO$_2$—, a divalent hydrocarbon radical containing from 1 to 10 carbon atoms, an oxygen, sulphur or nitrogen containing hydrocarbon radical or a covalent bond; each X is independently hydrogen,,halogen or a hydrocarbon group having from 1 to 10 carbon atoms, preferably from 1 to 4 carbon atoms and n has a value of 0 or 1. More preferably, A is a divalent hydrocarbon radical having from 1 to 8 carbon atoms and each X is hydrogen. Mixtures of two or more of polyhydric phenols can also be employed.

In addition, a mixture of one or more polyhydric phenols with one or more monohydric phenols such as p-tertiary butyl phenol or nonyl phenol can also be employed in the preparation of the hardener. When a mixture of polyhdyric and monohydric phenols is employed, the mixture advantageously contains a minor amount of the monohydric phenol. Preferably, less than 25, more preferably less than 15, weight percent of the total weight of the monohydric and polyhydric phenols is the monohydric phenol.

Most preferably, the phenol is a dihydric phenol, particularly 2,2-bis(4-hydroxyphenyl) propane, commonly referred to as bisphenol A (BPA).

The polyhydric phenolic hardener is prepared by reacting the phenol with the hexa-alkyl ether of hexamethylol melamine using amounts of the reactants to provide at least one, advantageously from 1.1 to 2.8, phenolic hydroxyl groups for each alkoxy group. The ratio of phenolic hydroxyl groups to alkoxy groups will affect the properties of the epoxy resin composition and the laminates prepared therefrom. For example, the epoxy resin composition prepared at the lower ratios of phenolic hydroxyl groups to alkoxy groups and the laminates prepared therefrom generally exhibit superior resistance to heat (e.g., higher glass transition temperature) and other enhanced properties. The varnish composition and laminates prepared therefrom generally exhibit the most desirable properties when prepared using a ratio of phenolic hydroxyl groups to alkoxy groups of less than two phenolic hydroxyl groups for each alkoxy groups. Preferably, the ratio of phenolic hydroxy groups to alkoxy groups is from 1.2/1 to 1.95/1, most preferably from 1.4/1 to 1.9/1.

In the preparation of the hardener, the reaction of the phenol and hexa-alkyl ether of hexamethylol melamine can be conducted neat (i.e., without using an organic liquid reaction diluent) if the polyhydric phenolic hardener is prepared at the higher ratios of phenolic hydroxyl groups to alkoxy groups (e.g., more than 2.2 phenolic hydroxyl groups per alkoxy group). In such case, a catalyst is not normally required or desired in the reaction mixture. Generally, the neat reaction is carried out at temperatures from 120° C. to 200° C. until completion as evidenced by the evolution of the monohydric alcohol corresponding to the alkoxy group ceasing When the polyhydric phenolic hardener is prepared at the preferred lower ratios of phenolic hydroxy groups to alkoxy groups (i.e., from 1 to less than 2 phenolic hydroxyl groups per alkoxy group), if the reaction is conducted neat at conditions such as described in U.S. Pat. No. 4,393,181, the reaction product typically becomes a gelled material which is not soluble in most common organic liquids prior to the desired conversion of the hexalkyl ether of hexamethylol melamine. To obtain a reaction product which is organic soluble at significantly greater yields, the preferred method for preparing the reaction product comprises reacting the phenol with the hexa-alkyl ether of hexamethylol melamine in the presence of a Lewis acid catalyst (e.g., a mono or dicarboxylic acid such as oxalic acid) using an organic liquid reaction diluent in which the phenol and the hexamethylol reactants and their reaction product are soluble such as lower ketone (e.g., methyl ethyl ketone). The organic liquid reaction diluent is advantageously employed in an amount from 5 to 80 percent based on the total weight of the reaction mixture, including volatiles and non-volatiles and the catalyst in an amount from 0.01 to 2 weight percent based on the total weight of the phenol and the hexa-alkyl ether of hexamethylol melamine.

The described reaction method is advantageously employed in preparing the polyhydric phenolic hardener at any of the stated ratios of phenolic OH groups to alkoxy groups, but is particularly useful in preparing the polyhydric phenolic hardener at the preferred lower ratios. The reaction is advantageously carried out at an elevated temperature, preferably from 80° C. to 250° C., more preferably from 100° to 220° C. The reaction is advantageously conducted until completion as evidenced by the ceasing of the evolution of monohydric alcohol corresponding to the alkoxide group.

Upon completion of the reaction of the hexamethylol melamine and phenol, the reaction product can subsequently be recovered from the organic liquid reaction diluent by evaporation of the reaction diluent such as by evaporating the organic liquid reaction diluent. In general, since the organic liquid reaction diluent is suitably employed as the solvent or as one component of the solvent for the epoxy resin composition of this invention, such recovery is not generally necessary or desirable.

The amount of the polyhydric phenolic hardener employed in the epoxy resin varnish composition of the present invention is dependent on a variety of factors including the specific polyhydric phenolic hardener and epoxy resin employed and the desired properties of the compositions and their specific end use applications. In general, the proportion of polyhydric phenolic hardener in the epoxy resin composition is selected to give the cured epoxy resin composition the maximum glass transition temperature. In general, such amounts will vary such that the ratio of phenolic hydroxyl groups in the polyhydric phenolic hardener to epoxy groups of the epoxy resin component in the varnish composition is from 0.5/1 to 2/1. Preferably, the polyhydric phenolic hardener is employed in amounts such that the epoxy resin composition comprise from 0.8 to 1.2. phenolic hydroxyl groups per epoxy group.

In the present invention, the stability of the epoxy resin composition is improved by adding an acid having a pKa of less than 2.5 or an ester or anhydride of said acid to the composition. Illustrative of such acids are the inorganic acids such as phosphoric acid, sulfurous acid or sulfuric acid; inorganic acid esters; half esters and partial esters such as dimethyl sulfate and monomethyl sulfate; inorganic acid anhydrides such as phosphoric acid anhydride ($P_2O_5$ or $P_4O_{10}$); strong organic acids, their esters and anhydrides e.g., the alkyl, aryl and aralkyl sulfonic or sulfinic acids such as p-toluene sulfonic acid, methyl or ethyl-p-toluene sulfonate and p-toluene sulfonic acid, anhydride. Of the foregoing compounds, those preferably employed as stabilizers herein are the alkyl, aryl and aralkyl sulfonic acids and the alkyl, aryl aralkyl sulfonates. Most preferred are methyl-p-toluene sulfonate and p-toluene sulfonic acid.

In the practice of the present invention, the strong acid or its ester or anhydride is employed in a stabilizing amount. By the term "stabilizing amount", it is meant that the viscosity of the epoxy resin composition containing the acid, ester or anhydride increases at a slower rate than the viscosity of an identical epoxy resin composition except containing no acid, ester or anhydride. Although the amounts of the acid, ester or anhydride required to impart the desired effect on the stability of the epoxy resin composition will vary depending on the specific acid, ester or anhydride as well as the specific epoxy resin, polyhydric phenolic hardener and organic solvent employed and the amounts of each component, the acid, ester or anhydride is generally advantageously employed in an amount of from 0.01 to 2 weight percent based on the total weight of the epoxy resin composition, including volatiles and non-volatiles. Preferably, the acid, ester or anhydride is employed in an amount of from 0.05 to 1, more preferably from 0.05 to 0.5, weight percent.

The epoxy resin compositions of the present invention will optionally contain a bisphenol or bisphenol derivative and/or an accelerator. The bisphenol or bisphenol derivative, if any, contained in the epoxy resin composition of the present invention are advantageously those bisphenol or bisphenol derivatives employed in the reaction with the hexa-alkyl ether of hexamethylol melamine to prepare the hardener. The preferred bisphenols or derivatives are those represented by the structural formula (I) wherein A is a divalent hydrocarbon radical having from 1 to 8 carbon atoms and each X is independently hydrogen or halogen, preferably hydrogen or bromine. The most preferred bisphenols or derivatives are those wherein A is a divalent hydrocarbon radical having from 1 to 6 carbon atoms and each X is independently hydrogen or bromine with at least two, preferably at least four, Xs are bromine. The amount of the bisphenol or bisphenol derivative employed, if any, will generally depend on the specific hardener, epoxy resin and accelerator, if any, employed and the desired properties of the cured resin. If employed, the bisphenol or bisphenol derivative is generally advantageously employed in an amount from 5 to 60 weight percent based on the total weight of the epoxy resin composition, including volatiles and non-volatiles. Preferably, the bisphenol or bisphenol derivative will be employed in an amount from 20 to 50, more preferably weight percent.

Illustrative examples of accelerators for the reaction between the polyhydric phenolic hardener and the epoxy resin are the stannous salts of monocarboxylic acids, such as stannous octoate and stannous laurate, various alkali metal salts such as lithium benzoate, certain heterocyclic compounds such as the imidazole and benzimidazole compounds and salts thereof, tertiary amine borates and tertiary amines. The heterocyclic compounds useful herein are generally those compounds which contain in the heterocyclic ring a substituted C=N-C group and a secondary amino group, i.e., an =N-H group, including the imidazoles, such as the substituted imidazoles and benzimidazoles having the general structural formula:

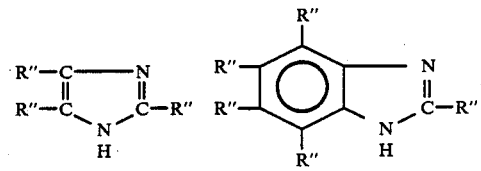

respectively, wherein each R" is individually a hydrogen, halogen, or an organic radical such as a hydrocarbon radical or a substituted hydrocarbon radical. Examples of substituted hydrocarbon radicals include the esters, ethers, amides, imides, amines, halogens and mercapto substituted hydrocarbon radicals. Preferably, each R" is a hydrogen or a hydrocarbon radical having from 1 to 4 carbon atoms.

Preferred accelerators are the imidazoles, particularly the alkyl-substituted imidazoles, such as benzyl dimethyl amine. Most preferably, the accelerator is benzyl dimethyl amine or 2-methyl imidazole.

In general, if employed, the accelerator is used in an amount sufficient to catalyze the reaction. Although such amounts will vary depending on the particular accelerator, epoxy resin and polyhydric phenolic hardener employed, the accelerators are generally used in amounts from 0.01 to 5 weight percent based on the total weight of the epoxy resin and hardener. Preferably, the accelerator is employed in an amount from 0.02 to 3 weight percent based on the total weight of the epoxy resin and polyhydric phenolic hardener.

In general, the presence of the accelerator will reduce the stability and, hence, the shelf life of the epoxy resin composition. Therefore, the accelerator, if employed, is advantageously added to the epoxy resin composition only shortly prior to the use of the composition in the preparation of the electrical laminates. Specifically, the epoxy resin, hardener, organic solvent, strong acid or the ester or anhydride thereof and polyhydric phenol, if employed, are initially combined for shipment and storage and the accelerator only added to this composition shortly before use.

The epoxy resin compositions of the present invention are particularly useful in impregnating weaves, webs, fabric and cloths of a variety of different materials including glass, quartz, carbon, aramid and boron fibers for electrical laminates. In the preparation of electrical laminates, a glass fiber is conventionally employed and the epoxy resin compositions of the present invention are most advantageously employed therewith.

The most preferred epoxy resin composition comprises from 5 to 50, preferably from 15 to 40, weight percent of the epoxy resin; from 5 to 40, preferably from 15 to 35, weight percent of the polyhydric phenolic hardener, from 20 to 35 weight percent of the organic solvent and from 25 to 50 weight percent of the bisphenol or bisphenol derivative, said weight percents being based on the total weight of the composition, with from 0.02 to 2 weight percent of an accelerator being subsequently added to the composition shortly before use to form a varnish composition which is subsequently applied to the reinforced web in the preparation of an electrical laminate.

In the method of the present invention for preparing electrical laminates, the varnish composition is applied to the reinforcing web in a desired amount and the web subsequently heated to advance and/or cure the epoxy resin. Although the amounts of the epoxy resin composition which are applied to the reinforcing web will vary depending on the specific web and epoxy resin composition employed and the desired properties of the impregnated cloth and electrical laminates prepared therefrom, the epoxy resin composition of the present invention is generally applied to the reinforcing web in conventional amounts; which amounts vary from 30 to 70 weight percent, based on the total weight of the impregnated web.

The impregnated web or prepreg is subsequently processed using conventional techniques. Such techniques involve advancing and/or curing the epoxy resin by heating the impregnated web to an elevated temperature such as from 100° C. to 200° C. Subsequently, the prepreg is fabricated into laminates by laminating one or more pregregs, commonly cut to a predetermined size, with thin layers of an electrical conductive material such as copper foil using elevating temperatures and pressures. Conventionally, the laminating temperatures vary from 130° to 230° C., with pressures varying from 34 kPa to 6.9 MPa.

The following examples are presented to illustrate the present invention and should not be construed to limit its scope. Unless otherwise indicated, the parts and percentages set forth in the examples are by weight.

Preparation of Hardener A

A jacketed stainless steel reactor equipped with an agitator, condensor and heating and cooling means was charged with 25 parts of hexamethoxymethyl melamine (Cymel ® 303 available from American Cyanamid), 25 parts of ethylene glycol monoethylether acetate and 75 parts of bisphenol A. This reaction mixture contains 1.71 phenolic —OH groups for each alkoxy group. The mixture was heated under a nitrogen blanket to 80° C. When the mixture had obtained this temperature, 0.09 parts of oxalic acid dihydrate were added as a catalyst. The temperature of the resulting reaction mixture was increased between 110° and 115° C. at which time measurable amounts of methanol began to be distilled off. The reaction mixture was slowly heated for an additional two hours to between 142° and 145° C. with methanol continued to be distilled off. The reaction was maintained at this temperature for an additional one hour. At the end of this time, methanol ceased to evolve from the reaction mixture. The reaction mixture was cooled to room temperature and then diluted with 65.5 parts of methyl ethyl ketone to give a solution containing 55 weight percent solids.

Based on the total solids of the resulting solution, the phenolic hydroxyl content was 8.1 weight percent or 0.48 penolic hydroxyl equivalents per 100 grams of solid material.

EXAMPLE 1

A. Preparation of the Epoxy Resin Varnish Composition

An epoxy resin solution was prepared by mixing 41.5 parts of the thus prepared polyhydric phenolic hardener solution (i.e., 23 parts of solid hardener) with 42 parts of a diglycidyl ether of bisphenol A having an EEW of between 177 and 188 and a viscosity at 25° C. between 7 and 10 Pa.s, 35 parts of tetrabromobisphenol A and 14 parts of the methyl ethyl ketone and 0.15 parts of methyl-p-toluene sulfonate. The solids content of the composition was 75 percent. This composition had an initial viscosity of 116 milliPascal seconds (mPa"s) as measured using a Canon-Fenske capillary viscometer.

B. Preparation of Electrical Laminates

To a one hundred part portion of the resulting epoxy resin composition was added 0.2 parts of 2-methylimidazole. The resulting varnish composition was used to impregnate Marglas 7628 finish 782 glass cloth. This cloth is an industrial glass fabric of plain weave, electrical grade glass treated with finish 782. The glass cloth was impregnated with the varnish on a horizontal type treater such that 180 grams (10 grams) of the resin composition were applied for each square meter of fabric. The impregnated cloth was then treated at temperatures between 130° and 170° C. to advance and/or cure the epoxy resin. The advanced prepregs were then fabricated into FR-4 type electrical laminates containing 2 plies of copper foil and 8 plies of the advanced prepregs. The epoxy resins of the laminates were cured by heating the laminate to 170° C. for 30 minutes and maintaining the temperature at 170° C. for 90 minutes and subsequently cooling with water for 20 minutes. The pressure during this curing stage was 40 kg/cm² (3922.7 kPa).

The glass transition temperature of the laminate prepared from the described epoxy resin composition was 137° C. and the onset temperature of thermal degradation was measured by thermal gravimetric analysis was 275° C. In addition, the blister resistance of the laminates was measured. This was measured by placing a series of laminates into a water bath maintained at 120° C. in an autoclave and after various times of aging placing five laminates into a solder bath at 260° C. for 30 seconds. It was found that after 90 minutes aging in the water bath, none of the laminates failed when placed in the solder bath. All the laminates placed in the solder bath failed after being aged 180 minutes in the water bath.

For purposes of comparison, laminates prepared from a standard epoxy resin varnish composition containing a dicyandiamide hardener used widely in commercial applications exhibited a glass transition temperature of 125°–130° C. and the onset temperature of thermal degradation was 260° C. Using the techniques as described in the preceding paragraph, laminates prepared from this varnish composition could be aged in the water bath 30 minutes prior to exhibiting failure upon their addition to the solder bath but could be aged only 60 minutes prior to all samples failing upon addition to the solder bath.

C. Stability Testing of the Epoxy Resin Composition

A second one hundred part portion of the resulting composition which did not contain the accelerator was stored at room temperature. After a period of one week, the viscosity of the composition had risen to only 120 mPa.s. After a period of three weeks, the viscosity of the composition had risen only 122 mPa.s and after a period of 12 weeks, the viscosity was 248 mPa.s. After storing at room temperature for 18 weeks, the viscosity of the composition had increased to 450 mPa.s.

EXAMPLE 2

Preparation of the Epoxy Resin Varnish Composition

An epoxy resin solution was prepared by mixing 42 parts of the above prepared polyhydric phenolic hardener solution (i.e., 23 parts of solid hardener) with 42 parts of a diglycidyl ether of bisphenol A having an EEW of between 177 and 188 and a viscosity at 25° C. between 7 and 10 Pa.s, 35 parts of tetrabromobisphenol A and 14 parts of the methyl ethyl ketone and 0.15 parts of p-toluene sulfonic acid. This composition had an initial viscosity of 165 milliPascal seconds (mPa.s) as measured using a Canon-Fenke capillary viscometer.

EXAMPLE 3

Preparation of the Epoxy Resin Varnish Composition

An epoxy resin solution was prepared by mixing 42 parts of the above prepared polyhydric phenolic hardener solution (i.e., 23 parts of solid hardener) with 42 parts of a diglycidyl ether of bisphenol A having an EEW of between 177 and 188 and a viscosity at 25° C. between 7 and 10 Pa s, 35 parts of tetrabromobisphenol A and 14 parts of the methyl ethyl ketone and 0.17 parts of ortho phosphonic acid. This composition had an initial viscosity of 180 milliPascal seconds (mPa.s) as measured using a Canon-Fenke capillary viscometer

COMPARATIVE EXAMPLE A

An epoxy resin composition identical to that of Example 1 was prepared except that the composition contained no methyl-p-toluene sulfonate. A portion of the composition was effectively employed in the preparation of an electrical laminate by adding the 2-methylimidazole to the composition immediately after its preparation and applying the composition immediately to the reinforced web.

A second portion of the epoxy resin composition containing no sulfonate and no -accelerator was stored at room temperature. After a period of three weeks, the viscosity of the composition had risen to 145 mPa.s. After being stored at room temperature for 12 weeks, the viscosity of the composition was 370 mPa.s and after 18 weeks storage at room temperature, the viscosity was 790 mPa.s.

The viscosity of the compositions prepared in Example 1, 2 and 3 and Comparative Example A was measured at 22° C. for a period of 96 days. The results are given in Table I below.

TABLE I

| Viscosity at 22° C. (mPa · s) | Ex. 1 | Ex. 2 | Ex. 3 | Ex. A |
|---|---|---|---|---|
| Initial | 160 | 165 | 180 | 168 |
| 8 days | 168 | 170 | 186 | 168 |
| 26 days | 186 | 166 | 187 | 194 |
| 35 days | 210 | 170 | 190 | 234 |
| 68 days | 392 | 218 | 270 | 460 |
| 96 days | 476 | 264 | 310 | 760 |

Table I demonstrates that the viscosity increase over 96 days for the compositions of the present invention is much lower than in the comparative composition which has no stabilizing additive.

The evidenced reduction in the rate of viscosity increase was also noted using an epoxy novolac as the epoxy resin component in the composition.

EXAMPLE 4

Preparation of the Epoxy Resin Varnish Composition

An epoxy resin solution was prepared by mixing 42 parts of the above prepared polyhydric phenolic hardener solution (i.e., 23 parts of solid hardener) wih 49.4 parts of an epoxy novolac resin having an EEW of between 176 and 181 and a viscosity at 25° C. between 0.6 and 1.6 Pa s (sold by the Dow Chemical Company as D.E.N. ® 438-EK85), 35 parts of tetrabromobisphenol A and 6.6 parts of the methyl ethyl ketone and 0.15 parts of methyl-p-toluene sulfonate. This composition had an initial viscosity of 400 milliPascal seconds (mPa.s) as measured using a Canon-Fenske capillary viscometer.

COMPARATIVE EXAMPLE B

An epoxy resin composition identical to that of Example 4 was prepared except that the composition contained no methyl-p-toluene sulfonate.

The viscosity of the composition prepared in Example 4 and Comparative Example B was measured at 22° C. for period of 90 days. The results are given in Table II below.

TABLE II

| Viscosity at 22° C. (mPa · s) | Ex. 4 | Ex. B |
| --- | --- | --- |
| Inital | 400 | 400 |
| 7 days | 470 | 456 |
| 14 days | 476 | 480 |
| 21 days | 520 | 545 |
| 28 days | 564 | 590 |
| 56 days | 985 | 1340 |
| 90 days | 2140 | 4300 tz,1/32 |

Table II demonstrates that the viscosity increase over 90 days for the composition of the present invention containing an epoxy novolac as the epoxy resin component is much lower than in the comparative composition having no stabilizing additive.

What is claimed is:

1. An epoxy resin composition comprising an epoxy resin possessing more than one 1,2-epoxy group, a polyhydric phenolic hardner, a volatile organic solvent for said epoxy resin and said hardner and an acid having a pKa of 2.5 or less at 25° C. or an ester or anhydride of such acid in an amount of from 0.01 to 2 weight percent based on the total weight of the epoxy resin composition, and said acid, ester or anhydride being selected from the group consisting of a phosphoric acid anhydride, dimethyl sulfate or monomethyl sulfate, alkyl, aryl, or aralkyl sulfonic acids, and alkyl, aryl or aralkyl sulfonates; wherein the hardner is the reaction product of one or more hexa-alkyl ethers of a hexamethylol melamines having the general formula:

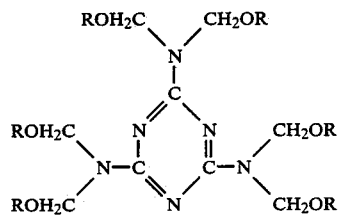

wherein each R is individually an alkyl radical having from 1 to 4 carbon atoms with one or more polyhydric phenol, or one or more polyhydric phenols and one or more monohydric phenols; the hexa-alkyl ether of the hexamethylol melamine and phenol being reacted in an amount sufficient to provide more than one reactive phenolic hydroxyl group for each alkoxy group.

2. The epoxy resin composition of claim 1 wherein the acid, ester or anhydride is p-toluene sulfonic acid, methyl or ethyl-p-toluene sulfonate.

3. The epoxy resin composition of claim 1 wherein the hexa-alkyl ether of hexamethylol melamine is hexamethoxy methylmelamine, hexaethoxy methylmelamine, hexapropoxy methylmelamine, hexa-1-butoxy methylmelamine, hexaisobutoxy methylmelamine or mixtures thereof.

4. The epoxy resin composition of claim 3 wherein the phenol and hexamethylol melamine used in preparing the hardener are employed in an amount to provide less than two reactive phenolic hydroxyl groups for each alkoxy group.

5. The epoxy resin composition of claim 4 wherein the ratio of phenolic hydroxyl groups to alkoxy groups is from 1.2/1 to 1.95/1 and the composition comprises from 0.5 to 2 phenolic hydroxy groups in the hardener per each epoxy group in the epoxy resin.

6. The epoxy resin composition of claim 5 wherein the phenol used in preparing the hardener is a dihydric phenol of the general structural formula:

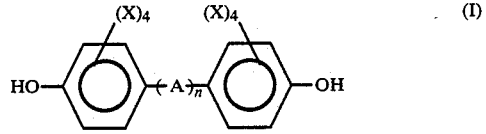

wherein A is oxygen, sulphur, -S-S-, -CO-, -SO-, -SO$_2$-, a divalent hydrocarbon radical containing from 1 to 10 carbon atoms, an oxygen, sulphur or nitrogen containing hydrocarbon radical or a covalent bond; each X is independently hydrogen, halogen or a hydrocarbon group having from 1 to 10 carbon atoms, preferably from 1 to 4 carbon atoms and n has a value of 0 or 1.

7. The epoxy resin composition of claim 6 wherein the phenol is 2,2-(4-hydroxy phenyl) propane.

8. The epoxy resin composition of claim 7 wherein the phenol is 2,2-bis(4-hydroxyphenyl) propane and the hexahexamethoxymethyl melamine.

9. The epoxy resin composition of claim 1 wherein the epoxy resin is a glycidyl polyether of 2,2-bis(4-hydroxyphenyl) propane, 2,2-bis(3,5-dibromo-4-hydroxyphenyl) propane or mixtures thereof; the glycidyl ether of a novolac resin or the glycidyl ether of tris(phenol)methane.

10. The epoxy resin composition of claim 1 wherein the solvent is an ester, glycol ether, ketone, aromatic hydrocarbon or mixture thereof and the composition comprises from 10 to 60 weight percent of the solvent.

11. The epoxy resin composition of claim 1 wherein the composition further contains a bisphenol.

12. The epoxy resin composition of claim 11, wherein the bisphenol is represented by the general formula:

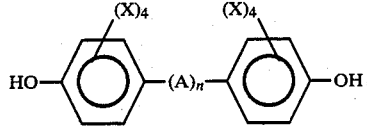

wherein A is oxygen, sulphur, —S—S—, —CO—, —SO—, —SO2—, a divalent hydrocarbon radical containing from 1 to 10 carbon atoms, an oxygen, sulphur or nitrogen containing hydrocarbon radical or a covalent bond; each X is independently hydrogen, halogen or a hydrocarbon group having from 1 to 10 carbon atoms, and n has a value of 0 or 1.

13. The epoxy resin composition of claim 12 wherein the bisphenol is represented by the general formula wherein A is a bivalent hydrocarbon radical having from 1 to 8 carbon atoms and each X is independently hydrogen or halogen.

14. The epoxy resin composition of claim 12 wherein the bisphenol is a tetrabromobisphenol A.

15. The epoxy resin composition of claim 11 wherein the composition further comprises from 0.01 to 5 weight percent, based on the weight of the epoxy resin hardner, of an accelerator of a stannous salt of monocarboxylic acid, an alkali metal salt, imidazole or benzimidazole compound and salts thereof, a tertiary amine borate or a tertiary amine.

16. The epoxy resin composition of claim 15 wherein the accelerator is an alkyl-substituted imidazole or a tertiary amine.

17. The epoxy resin composition of claim 1 further comprising an accelerator.

18. The epoxy resin composition of claim 11 further comprising an accelerator.

* * * * *